United States Patent
Hu (10) Patent No.: US 9,478,512 B2
(45) Date of Patent: Oct. 25, 2016

(54) SEMICONDUCTOR PACKAGING STRUCTURE HAVING STACKED SEED LAYERS

(71) Applicant: DAWNING LEADING TECHNOLOGY INC., Miao-Li (TW)

(72) Inventor: Yu-Shan Hu, Miao-Li (TW)

(73) Assignee: DAWNING LEADING TECHNOLOGY INC., Miao-Li (TW)

( * ) Notice: Subject to any disclaimer, the term of this patent is extended or adjusted under 35 U.S.C. 154(b) by 0 days.

(21) Appl. No.: 14/619,404

(22) Filed: Feb. 11, 2015

(65) Prior Publication Data
US 2016/0233182 A1    Aug. 11, 2016

(51) Int. Cl.
*H01L 23/00* (2006.01)

(52) U.S. Cl.
CPC .............. *H01L 24/06* (2013.01); *H01L 24/03* (2013.01); *H01L 24/11* (2013.01); *H01L 24/14* (2013.01); *H01L 2224/0401* (2013.01); *H01L 2224/065* (2013.01); *H01L 2924/01022* (2013.01); *H01L 2924/01028* (2013.01); *H01L 2924/01029* (2013.01); *H01L 2924/01079* (2013.01); *H01L 2924/37001* (2013.01)

(58) Field of Classification Search
CPC ....... H01L 24/06; H01L 24/03; H01L 24/11; H01L 24/14
See application file for complete search history.

(56) References Cited

U.S. PATENT DOCUMENTS

| 6,020,640 | A * | 2/2000 | Efland | H01L 23/53233 257/751 |
| 6,489,229 | B1 * | 12/2002 | Sheridan | H01L 24/03 257/E21.508 |
| 6,586,322 | B1 * | 7/2003 | Chiu | H01L 24/03 257/E21.508 |
| 6,917,106 | B2 * | 7/2005 | Datta | H01L 24/03 257/737 |
| 7,271,030 | B2 * | 9/2007 | Bojkov | H01L 24/05 257/E21.511 |
| 7,615,407 | B1 * | 11/2009 | Poddar | H01L 21/568 257/E21.508 |
| 7,838,991 | B1 * | 11/2010 | Mostafazadeh | H01L 24/03 257/737 |
| 8,022,543 | B2 * | 9/2011 | Farooq | H01L 24/11 257/734 |
| 8,178,977 | B2 * | 5/2012 | Kawashita | H01L 21/76898 257/737 |
| 8,426,966 | B1 * | 4/2013 | Huemoeller | H01L 24/11 257/738 |
| 8,735,281 | B2 * | 5/2014 | Shin | H01L 23/525 257/E23.02 |
| 8,865,585 | B2 * | 10/2014 | Chou | H01L 23/525 257/774 |
| 8,907,407 | B2 * | 12/2014 | Oikawa | H01L 29/41741 257/329 |
| 8,963,316 | B2 * | 2/2015 | Hsu | H01L 23/48 257/692 |
| 9,142,498 | B2 * | 9/2015 | Noh | H01L 23/49811 |
| 2011/0115073 | A1 * | 5/2011 | Chen | H01L 24/05 257/737 |
| 2014/0367856 | A1 * | 12/2014 | Shih | H01L 23/49811 257/741 |
| 2016/0005702 | A1 * | 1/2016 | Shih | H01L 24/04 257/737 |

FOREIGN PATENT DOCUMENTS

TW        488052 B       5/2002

* cited by examiner

*Primary Examiner* — Ida M Soward
(74) *Attorney, Agent, or Firm* — Hauptman Ham, LLP (57) ABSTRACT

A semiconductor packaging structure includes a chip, a metal barrier layer, a dielectric layer and two metal seed layers. The chip has a top surface, connection pads on the top surface, and a passivation layer on the top surface and partly covering the connection pads. The metal barrier layer is disposed on each of the connection pads; the dielectric layer is disposed on the passivation layer and the metal barrier layer, and has through holes to expose the metal barrier layer. The first of the metal seed layers is disposed on the dielectric layer and the exposed metal barrier layer, while the second metal seed layer is disposed on the first metal seed layer. Therefore, the metal barrier layer can effectively prevent damage to the connection pads of the chip during the manufacturing process.

9 Claims, 15 Drawing Sheets

SEMICONDUCTOR PACKAGING STRUCTURE HAVING STACKED SEED LAYERS

BACKGROUND OF THE INVENTION

1. Field of the Invention

The present invention relates to a packaging structure and a manufacturing method for the same, and more particularly, to a semiconductor packaging structure and a manufacturing method for the same.

2. Descriptions of the Related Art

Flip chip packaging all have a plurality of bumps disposed on the chip so that the chip is electrically connected to other devices via the bumps.

The bumps may be disposed on the chip in the following three ways: direct bump, re-passivation and redistribution. In re-passivation and redistribution, usually a photolithography process is used to form one or more patterned passivation layers (or "dielectric layers"). Upon completion of the photolithography process, a cleaning step is carried out to remove the residual developer or other contaminants to avoid damage of the pads of the chip due to the residuals or contaminants (e.g., oxidation, erosion, elevation and etc. of the pads). For example, the photolithography process and the cleaning step mentioned above are disclosed in Taiwan Patent Publication No. 488052.

However, it is still difficult to completely remove the residuals or contaminants through the cleaning step, so the pads of the chip are still likely to be damaged.

Additionally, the chip is received in a receiving box or receiving cabinet before being subjected to the bump process. During the period of being received therein, the pads of the chip might be exposed to the air, so it is still possible that the pads are oxidized.

Accordingly, a need exists in the art to provide a technical solution capable of making improvements on at least one of the aforesaid shortcomings.

SUMMARY OF THE INVENTION

An objective of the present invention is to provide a semiconductor structure and a manufacturing method for the same, which can solve at least one technical problem with the prior art (i.e., at least make the pads of the chip less liable to damage).

To achieve the aforesaid objective, a method for manufacturing a semiconductor packaging structure disclosed by the present invention comprises the following steps: providing a chip with a top surface, a plurality of connection pads and a passivation layer, wherein the connection pads and the passivation layer are disposed on the top surface, and the passivation layer partly covers the connection pads; forming a metal barrier layer on each of the connection pads; forming a first dielectric layer on the passivation layer and the metal barrier layer; removing part of the first dielectric layer to expose the metal barrier layer from the first dielectric layer; forming a first metal seed layer on the first dielectric layer and the exposed metal barrier layer by electroless plating; and forming a second metal seed layer on the first metal seed layer by electroless plating.

To achieve the aforesaid objective, a semiconductor packaging structure disclosed by the present invention comprises the following components: a chip with a top surface, a plurality of connection pads and a passivation layer, wherein the connection pads and the passivation layer are disposed on the top surface, and the passivation layer partly covers the connection pads; a metal barrier layer, disposed on each of the connection pads; a first dielectric layer, disposed on the passivation layer and the metal barrier layer, with a plurality of through holes to expose the metal barrier layer from the first dielectric layer; a first metal seed layer, disposed on the first dielectric layer and the exposed metal barrier layer; and a second metal seed layer, disposed on the first metal seed layer.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIGS. 3A~5D are schematic views illustrating steps comprised in a method fir manufacturing a semiconductor packaging structure according to the third preferred embodiment of the present invention, where

DESCRIPTION OF THE PREFERRED EMBODIMENT

A semiconductor packaging structure and a method for manufacturing the same are provided and hereinafter, the semiconductor packaging structure will be described firstly.

Figure 1:
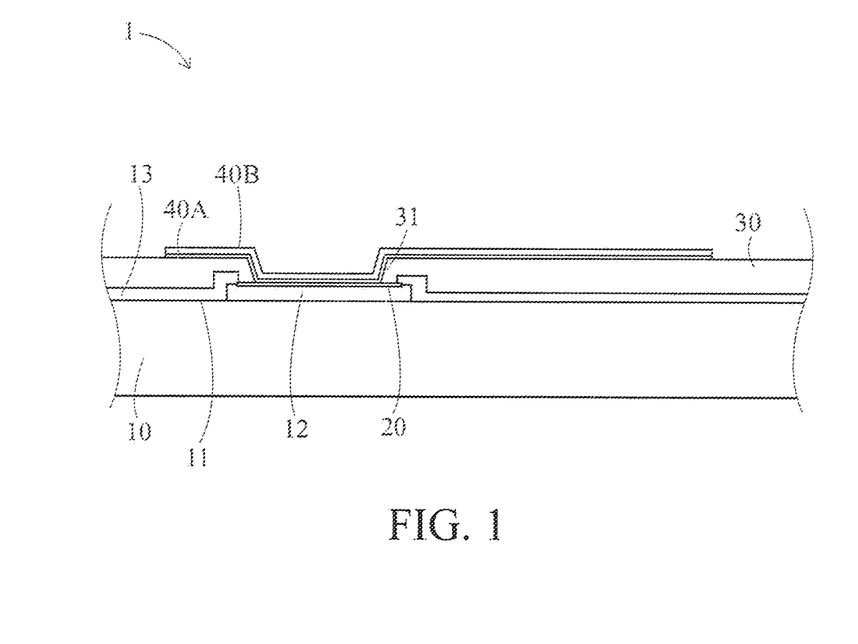
FIG. 1 is a schematic view of a semiconductor packaging structure according to the first preferred embodiment of the present invention.

FIG. 1 illustrates a schematic view of a semiconductor packaging structure according to the first preferred embodiment of the present invention. The semiconductor packaging structure 1 may have bumps directly disposed thereon or indirectly disposed thereon through a redistribution layer (not depicted). The semiconductor packaging structure 1 comprises the following components: a chip 10, a metal barrier layer 20, a first dielectric layer 30, a first metal seed layer 40A and a second metal seed layer 40B. Hereinafter, each of the elements will be described in sequence.

The chip 10 is a chip that has been formed with an integrated circuit (not depicted) through a semiconductor manufacturing process. The chip 10 has a top surface 11 and a plurality of connection pads 12 (only one connection pad is illustrated in this embodiment). The connection pads 12 are disposed on the top surface (or called "an active surface") 11 of the chip 10. The materials used to manufacture the connection pads 12 may include aluminum, copper-aluminum, tin or the like metals or alloys. The chip 10 may further comprise a passivation layer 13, which is also disposed on the top surface 11 of the chip 10 and partly covers the connection pads 12 (e.g., covering the periphery of the connection pads 12) to expose part of the top surface of the connection pads 12.

The metal barrier layer 20 is disposed on each of the connection pads 12 (i.e., each of the connection pads 12 has a metal barrier layer 20 disposed thereon) to cover the exposed top surface of the connection pads 12 for protecting the connection pads 12. That is, the metal barrier layer 20 can effectively prevent the connection pads 12 from being exposed to the air or substances used in the manufacturing
} process to prevent damage to the connection pads 12, such as oxidation, erosion, elevation and etc.

The metal barrier layer 20 is preferred to be disposed on the connection pads 12 through electroless plating to reduce the manufacturing cost; additionally, the electroless-plated metal barrier layer 20 can be smoothly bonded to the first dielectric layer 30 described hereinbelow so that a stronger binding force therebetween is resulted. The materials used to manufacture the metal barrier layer 20 may include nickel or titanium, which allows the first metal seed layer 40A described hereinbelow to be easily disposed on the metal barrier layer 20; in other words, the materials used to manufacture the metal barrier layer 20 is chosen according to the materials to manufacture the first metal seed layer 40A.

The first dielectric layer 30 is disposed on the passivation layer 13 of the chip 10 and the metal barrier layer 20, and has a plurality of through holes 31 (only one through hole is illustrated in the drawings) to expose the metal barrier layer 20 from the through holes 31 of the first dielectric layer 30. The openings of the through holes 31 may be equal to or smaller than the corresponding top surface of the metal barrier layer 20 to expose the top surface of the metal barrier layer 20 completely or partly. The periphery of the top surface of the metal barrier layer 20 is preferred to be covered by the first dielectric layer 30 so that the top surface of the metal barrier layer 20 is exposed partly.

Additionally, the first dielectric layer 30 may preferably cover the passivation layer 13 of the chip 10 completely, and the materials used to manufacture the first dielectric layer 30 may be dielectric materials such as benzocyclobutene (BCB) or polyimide (PI).

The first metal seed layer 40A is disposed on the first dielectric layer 30 and the exposed metal barrier layer 20; that is, the first metal seed layer 40A extends continuously from the top surface of the first dielectric layer 30 to wall surfaces of the through holes 31 and then to the top surface of the metal barrier layer 20 located in the through holes 31. Additionally, the first metal seed layer 40A may be disposed only on part of the top surface of the first dielectric layer 30.

The first metal seed layer 40A may be disposed on the first dielectric layer 30 and the metal barrier layer 20 through electroless plating. When the metal barrier layer 20 is formed through electroless plating, the first metal seed layer 40A can be easily formed on the metal barrier layer 20 through electroless plating, while the first metal seed layer 40A and the metal barrier layer 20 can be well bonded together.

As discussed above, the materials used to manufacture the metal barrier layer 20 is chosen according to the materials to manufacture the first metal seed layer 40A. The materials that are preferred for manufacturing the metal barrier layer 20 and the first metal seed layer 40A are identical to make the bonding therebetween better; therefore, the materials used to manufacture the first metal seed layer 40A and the metal barrier layer 20 may both include nickel or titanium.

The second metal seed layer 40B is disposed on the first metal seed layer 40A, and may preferably cover the top surface of the first metal seed layer 40A completely. Thus, the distribution range of the second metal seed layer 40B is the same as the first metal seed layer 40A (i.e., is located on the first dielectric layer 30 and the exposed metal barrier layer 20).

The second metal seed layer 40B may be disposed on the first metal seed layer 40A through electroless plating. During electroless plating, the second metal seed layer 40B that is formed on the first metal seed layer 40A is easy, and the bonding between the first metal seed layer 40A and the second metal seed layer 40B is better. Preferably, the materials that are used to manufacture the second metal seed layer 40B may include gold or copper to facilitate the disposition of gold bumps, copper bumps or the redistribution layer (not depicted), described in other embodiments on the second metal seed layer 40B.

Figure 2:
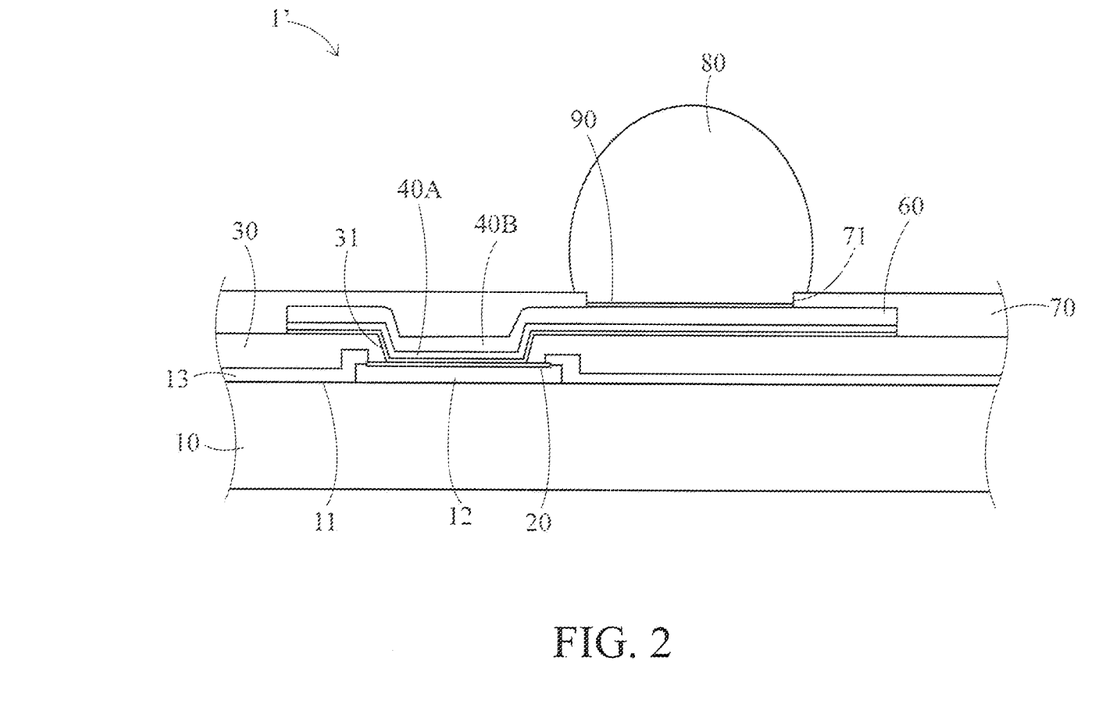
FIG. 2 is a schematic view of a semiconductor packaging structure according to the second preferred embodiment of the present invention.

FIG. 2 illustrates a schematic view of a semiconductor packaging structure according to the second preferred embodiment of the present invention. The semiconductor packaging structure 1' comprises components of the semiconductor packaging structure 1, namely, a chip 10, a metal barrier layer 20, a first dielectric layer 30, a first metal seed layer 40A and a second metal seed layer 40B, so the technical contents of these components can be referenced to the corresponding components of the semiconductor packaging structure 1. The semiconductor packaging structure 1' may further comprise a redistribution layer 60, a third dielectric layer 70 and a plurality of bumps 80. Hereinafter, these components will be described in sequence.

The redistribution layer 60 is disposed on the second metal seed layer 40B, and may preferably completely cover the top surface of the second metal seed layer 40B. Therefore, the distribution range of the redistribution layer 60 may be the same as the second metal seed layer 40B; and in other words, when the first metal seed layer 40A and the second metal seed layer 40B are located only on part of the first dielectric layer 30, the redistribution layer 60 is also located only on part of the first dielectric layer 30. Additionally, lateral surfaces (vertical surfaces) of the first metal seed layer 40A and the second metal seed layer 40B may be coplanar with the lateral surface of the redistribution layer 60.

Additionally, the materials used to manufacture the redistribution layer 60 and the second metal seed layer 40B may be identical to facilitate the bonding therebetween. Therefore, the materials used to manufacture the redistribution layer 60 and the second metal seed layer 40B may include, for example, copper.

The third dielectric layer 70 is disposed on the redistribution layer 60 and has a plurality of through holes 71 (only one through hole is illustrated in the drawings) to expose part of the redistribution layer 60 from the through holes 71 of the third dielectric layer 70. In other words, part of the top surface of the redistribution layer 60 is not covered by the third dielectric layer 70. The third dielectric layer 70 may cover two lateral surfaces (vertical surfaces) of the first metal seed layer 40A and the second metal seed layer 40B and two lateral surfaces of the redistribution layer 60.

The bumps 80 are disposed on the redistribution layer 60 and are exposed by the through holes 71; in other words, the bumps 80 are respectively disposed in the through holes 71 to electrically connect with the redistribution layer 60. The bumps 80 may be gold bumps or copper bumps.

The semiconductor packaging structure 1' may optionally comprise an alloy layer 90, which is disposed between the exposed redistribution layer 60 and the bumps 80. In other words, the alloy layer 90 is disposed on the top surface of the redistribution layer 60 in the through holes 71, and then the bumps 80 are disposed on the alloy layer 90. The alloy layer 90 is used to strengthen the binding force between the bumps 80 and the redistribution layer 60, so the materials that are used to manufacture the alloy layer 90 are associated with the materials to manufacture the bumps 80 and the redistribution layer 60. The materials of the alloy layer 90 may be a combination of materials, such as nickel, copper and tin; for example, the alloy layer 90 may be a nickel-copper alloy or tin-nickel alloy.

It is noted that one part of the alloy layer 90 may be formed integrally with the bumps 80, and the other part may be formed integrally with the redistribution layer 60 after formation of the alloy layer 90. Therefore, if the semiconductor packaging structure 1' is cut open to observe the cross-section thereof, the alloy layer 90 will not be easily identified.

Thus, the technical contents of the components of the semiconductor packaging structures 1 and 1' have been described, and the semiconductor packaging structures 1 and 1' can at least provide the following features. The metal barrier layer 20 can protect the connection pads 12 of the chip 10 from being easily damaged, and can especially reduce the oxidation of the connection pads 12. As the oxidation of the connection pads 12 is reduced (i.e., the oxide layer becomes less), the conduction resistance (Rds-on) of the connection pads 12 can be reduced correspondingly. Additionally, the metal barrier layer 20 may be formed through electroless plating, so there is no need to form the metal barrier layer 20 through processes, such as physical vapor deposition (PVD) with a high manufacturing cost. Furthermore, when the metal barrier layer 20 is formed through electroless plating, the first metal seed layer 40A, which is formed also through electroless plating, can be easily formed on the metal barrier layer 20 to result in a tight bonding therebetween. The metal barrier layer 20 formed through electroless plating can also be bonded to the first dielectric layer 30 smoothly.

Next, a method for manufacturing a semiconductor packaging structure according to the third preferred embodiment of the present invention will be described. The manufacturing method can at least manufacture the semiconductor packaging structures 1 and 1' described above, so reference may be made to the technical contents of the semiconductor packaging structures 1 and 1' when realizing the manufacturing method and vice versa. However, it is noted that the method to manufacture the semiconductor packaging structures 1 and 1' is not limited thereto.

Figure 3A:
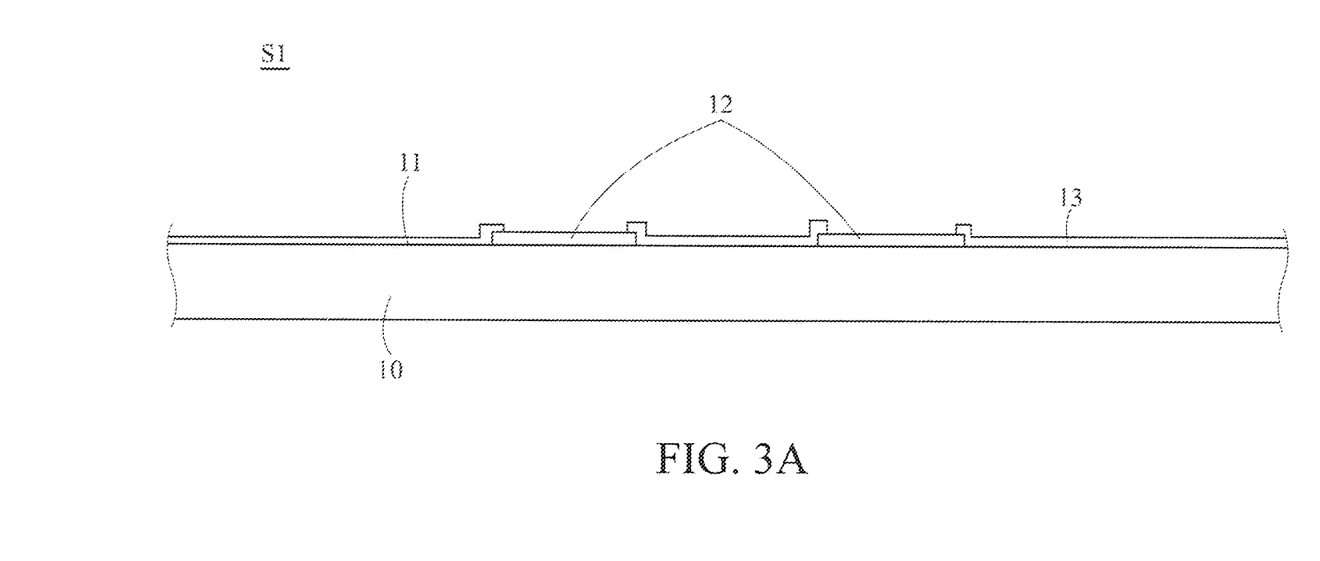

The manufacturing method may start from step S1 (as shown in FIG. 3A), that is, to provide a chip 10. The chip 10 has a top surface 11, a plurality of connection pads 12 and a passivation layer 13. The connection pads 12 and the passivation layer 13 are disposed on the top surface 11 of the chip 10, and the passivation layer 13 partly covers the connection pads 12 to expose part of the top surface of the connection pads 12.

Figure 3B:
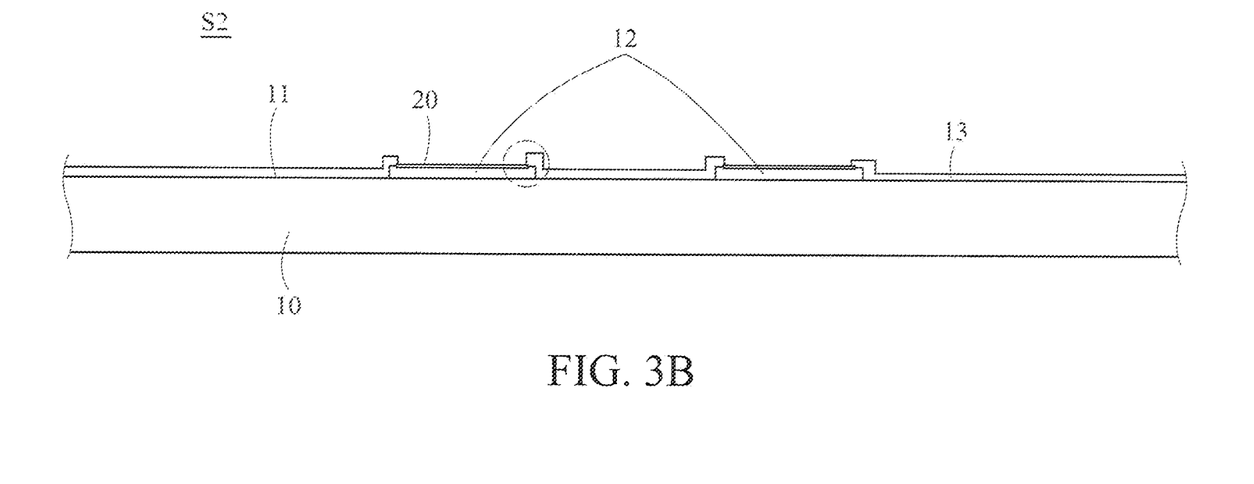
Figure 3C:
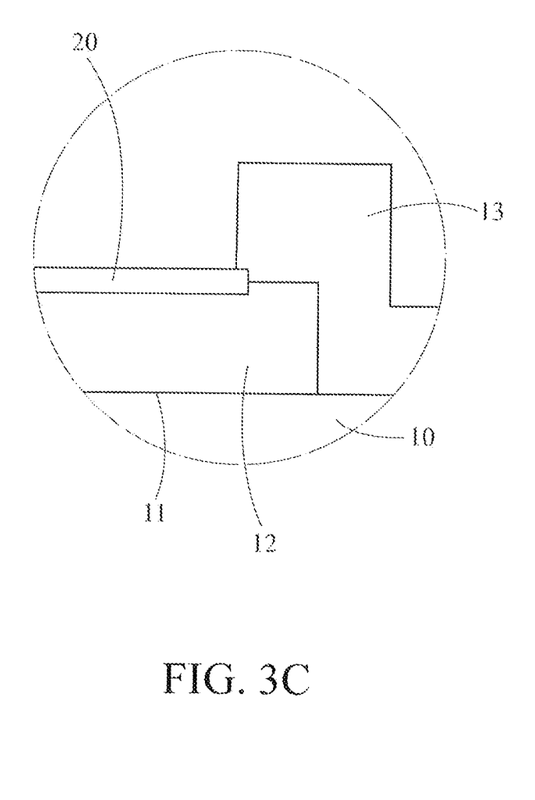
FIG. 3C is a partially enlarged detailed view of FIG. 3B.

Then, step S2 (as shown in FIG. 3B and FIG. 3C) is executed to form a metal barrier layer 20 on each of the connection pads 12. Each of the connection pads 12 is formed with the metal barrier layer 20 to cover the exposed top surface of the connection pads 12 for the purpose of protecting the connection pads 12. In this way, the metal barrier layer 20 can effectively prevent the connection pads 12 from being exposed to the air or substances used in subsequent manufacturing processes and prevent damage to the connection pads 12 due to the air or the substances. The metal barrier layer 20 is preferred to be formed on the connection pads 12 through electroless plating to reduce the manufacturing cost of the metal barrier layer 20. The materials used to manufacture the metal barrier layer 20 may include nickel or titanium.

Figure 3D:
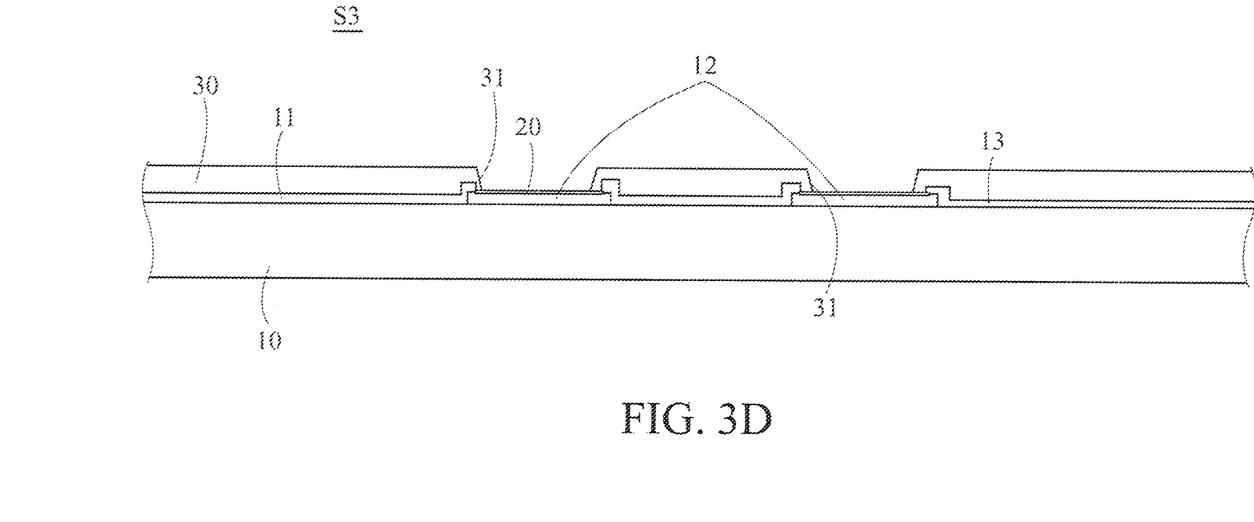

Then, step S3 (as shown in FIG. 3D) is executed to form a first dielectric layer 30 on the passivation layer 13 and the metal barrier layer 20. A part of the first dielectric layer 30 is removed to expose the metal barrier layer 20 from the first dielectric layer 30. Specifically, the first dielectric layer 30 may initially cover the passivation layer 13 and the metal barrier layer 20 completely, and then part of the first dielectric layer 30 is removed (i.e., to form a plurality of through holes 31) through a photolithography process (i.e. exposure, developing, and curing) or a laser process to expose part of or all of the top surface of the metal barrier layer 20.

If the through holes 31 of the first dielectric layer 30 are formed through the photolithography process, the residual developer or other contaminants are less liable to damage the connection pads 12 of the chip 10. The metal barrier layer 20 can decrease the possibility that the connection pads 12 are accessed by the substances.

Figure 3E:
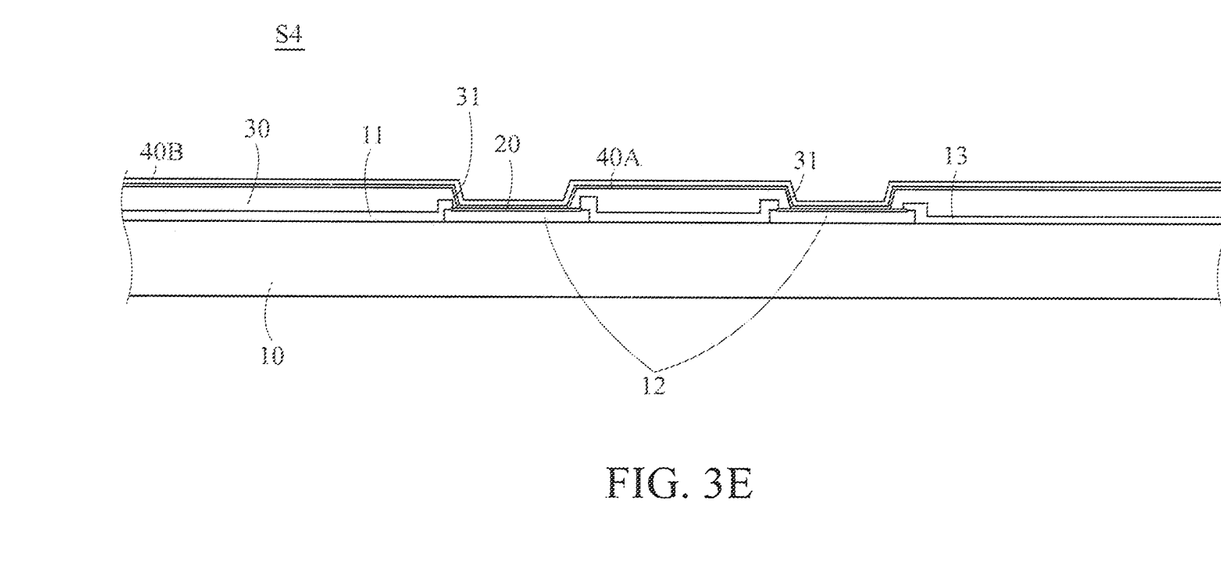

Then, step S4 (as shown in FIG. 3E) is executed to form a first metal seed layer 40A on the first dielectric layer 30 and the exposed metal barrier layer 20 through electroless plating. A second metal seed layer 40B is then formed on the first metal seed layer 40A, also through electroless plating. In other words, the first metal seed layer 40A and the second metal seed layer 40B are formed on the first dielectric layer 30 and the exposed metal barrier layer 20 through electroless plating in sequence. Preferably, the materials used to manufacture the metal barrier layer 20 and the first metal seed layer 40A are the same, so the materials used to manufacture the first metal seed layer 40A may include nickel or titanium; and the materials used to manufacture the second metal seed layer 40B may include copper or gold.

Upon completion of steps S1~S4, the semiconductor packaging structure 1 in the first embodiment can be obtained.

It is noted that after step S2, (i.e., forming a metal barrier layer 20 on each of the connection pads 12) is completed, the chip 10 may be optionally received into a receiving unit such as a wafer cassette temporarily, and will be taken out when a subsequent step is to be executed. Because the connection pads 12 of the chip 10 are protected by the metal barrier layer 20, it is less likely for the connection pads 12 to be exposed or accessed to the air in the receiving unit. The connection pads 12 are less liable to oxidation.

Figure 4A:
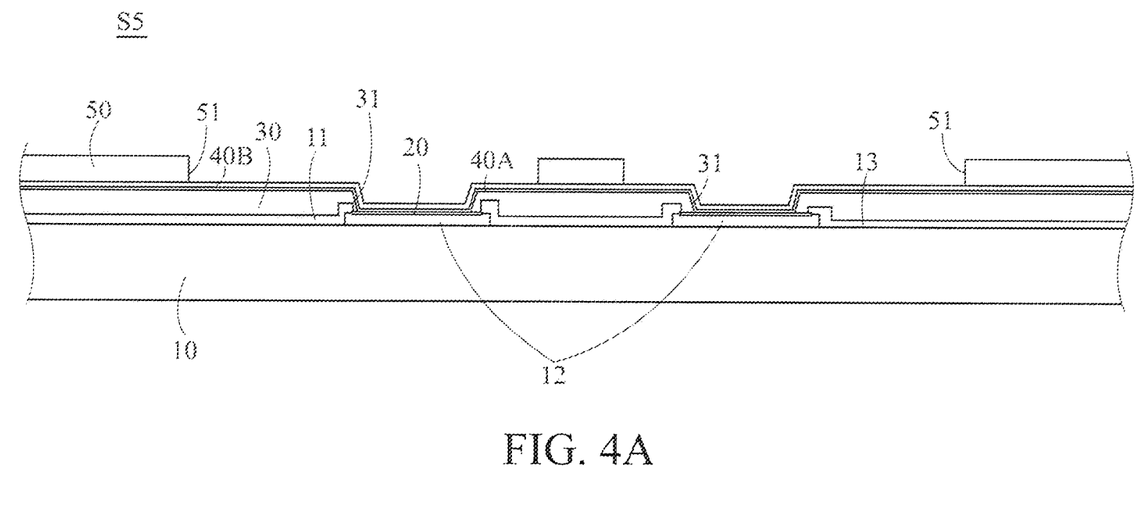

Thereafter, steps S5-S8 may be optionally executed to form a redistribution layer 60 on the semiconductor packaging structure 1. First, in step S5 as shown in FIG. 4A, a second dielectric layer 50 is formed on the second metal seed layer 40B, and then part of the second dielectric layer 50 is removed to expose part of the second metal seed layer 40B from the second dielectric layer 50. In other words, the second dielectric layer 50 initially covers the top surface of the second metal seed layer 40B, and then part of the second dielectric layer 50 is removed through a photolithography process or a laser process (i.e., to form a plurality of through holes 51) to expose part of the top surface of the second metal seed layer 40B. The through holes 51 of the second dielectric layer 50 have a shape or profile corresponding to that of the redistribution layer 60.

Figure 4B:
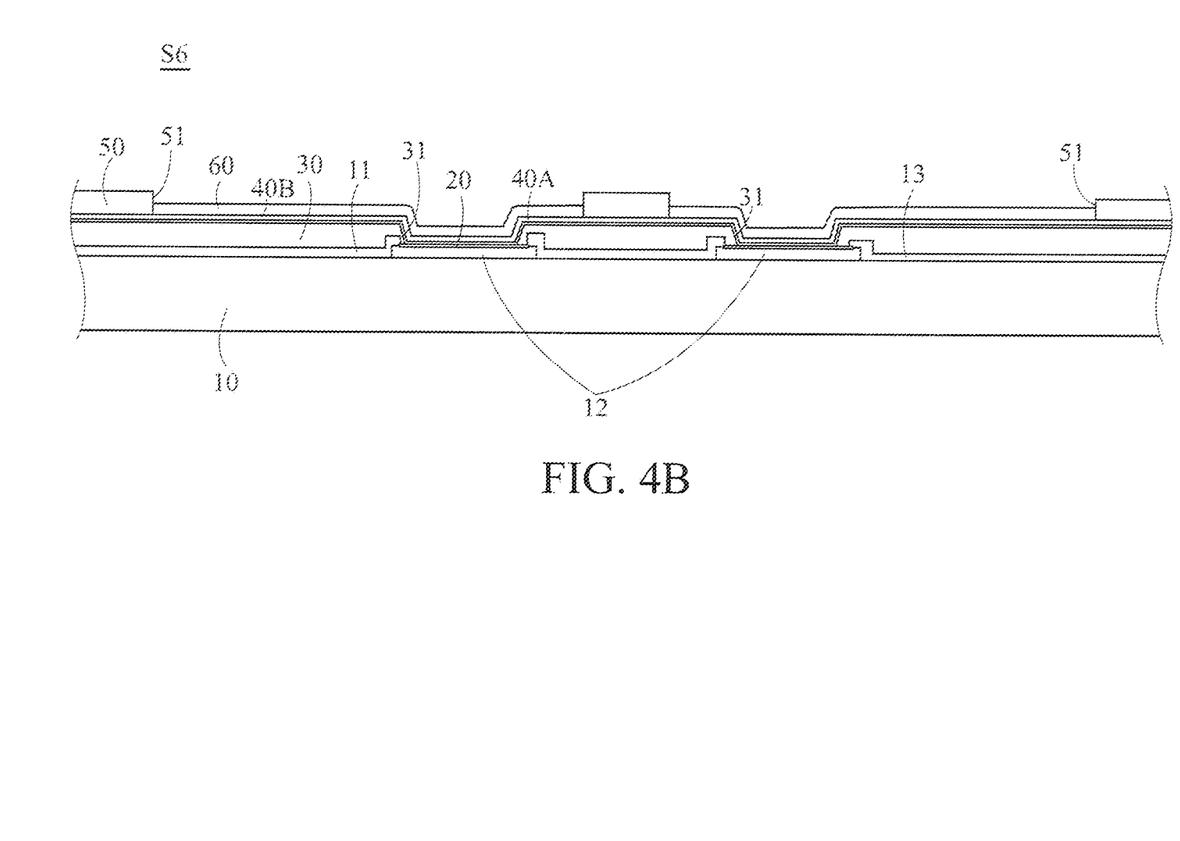

Then, in step S6 as shown in FIG. 4B, a redistribution layer 60 is formed on the exposed second metal seed layer 40B; in other words, the redistribution layer 60 is formed in the through holes 51 of the second dielectric layer 50 and comes into contact with the second metal seed layer 40B. The materials used to manufacture the redistribution layer 60 and the second metal seed layer 40B may be the same, so the redistribution layer 60 may be manufactured by gold or copper.

Figure 4C:
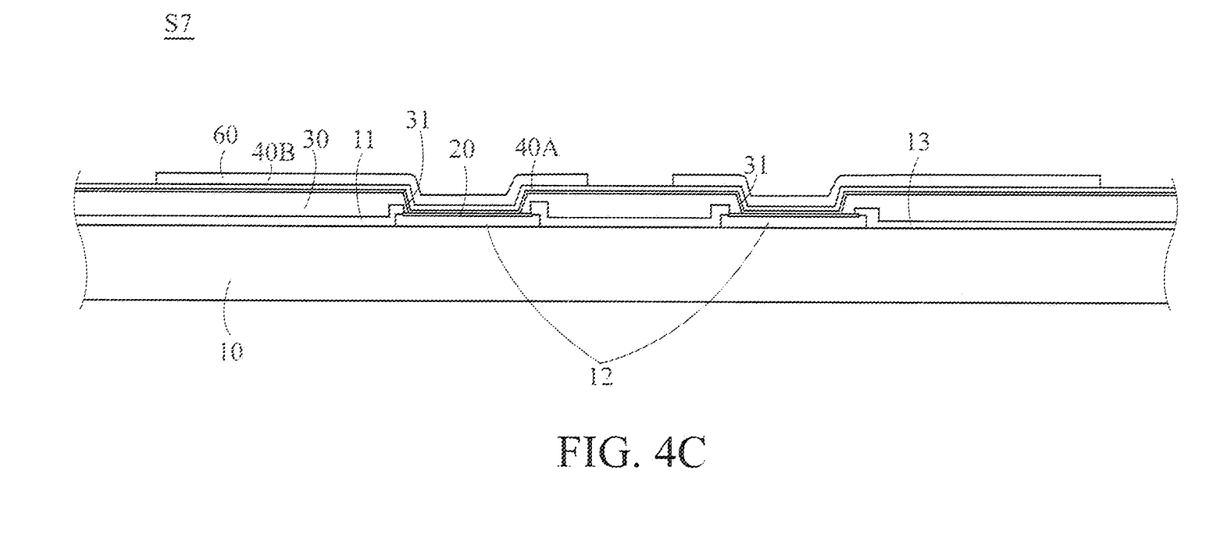
Figure 4D:
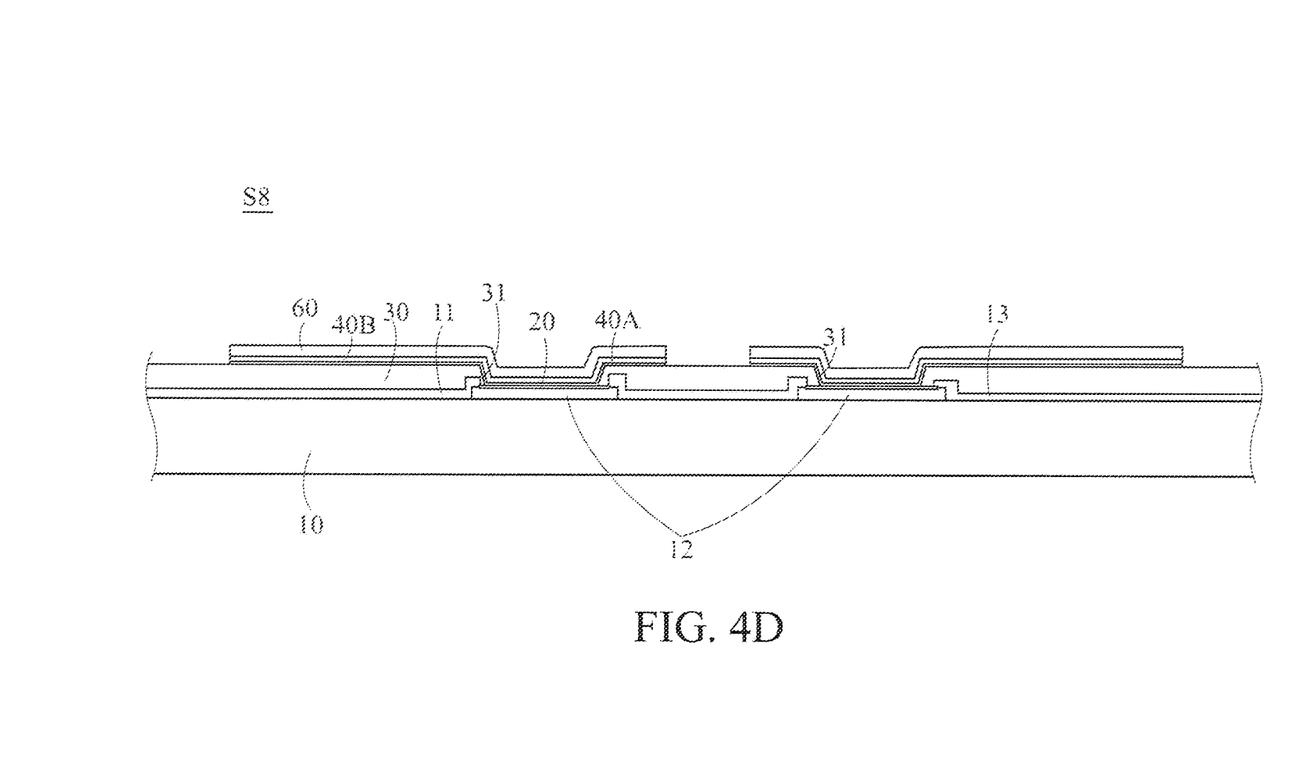

Next, in step S7 as shown in FIG. 4C, the remaining second dielectric layer 50 is removed. In this step, the second dielectric layer 50 for defining the shape and size of the redistribution layer 60 will be removed completely so that only the redistribution layer 60 remains on the top surface of the second metal seed layer 40B.

Finally, in step S8 as shown in FIG. 4C, the second metal seed layer 40B and the first metal seed layer 40A, which are underneath the remaining second dielectric layer 50 in the step S5, are removed. That is, both the second metal seed layer 40B and the first metal seed layer 40A beside the lateral faces of the redistribution layer 60 are removed to separate the individual parts of the redistribution layer 60 from each other instead of being electrically connected with each other.

After steps S5~S8 are completed, the redistribution layer 60 is obtained on the semiconductor packaging structure 1. It is noted that the redistribution layer 60 may also be formed in other ways, for example, by coating the redistribution layer 60 on specific positions of the top surface of the second metal seed layer 40B through printing.

Thereafter, steps S9~S11 may be optionally executed to dispose a plurality of bumps 80 on the redistribution layer 60, thereby completing the semiconductor packaging structure 1'.

Figure 5A:
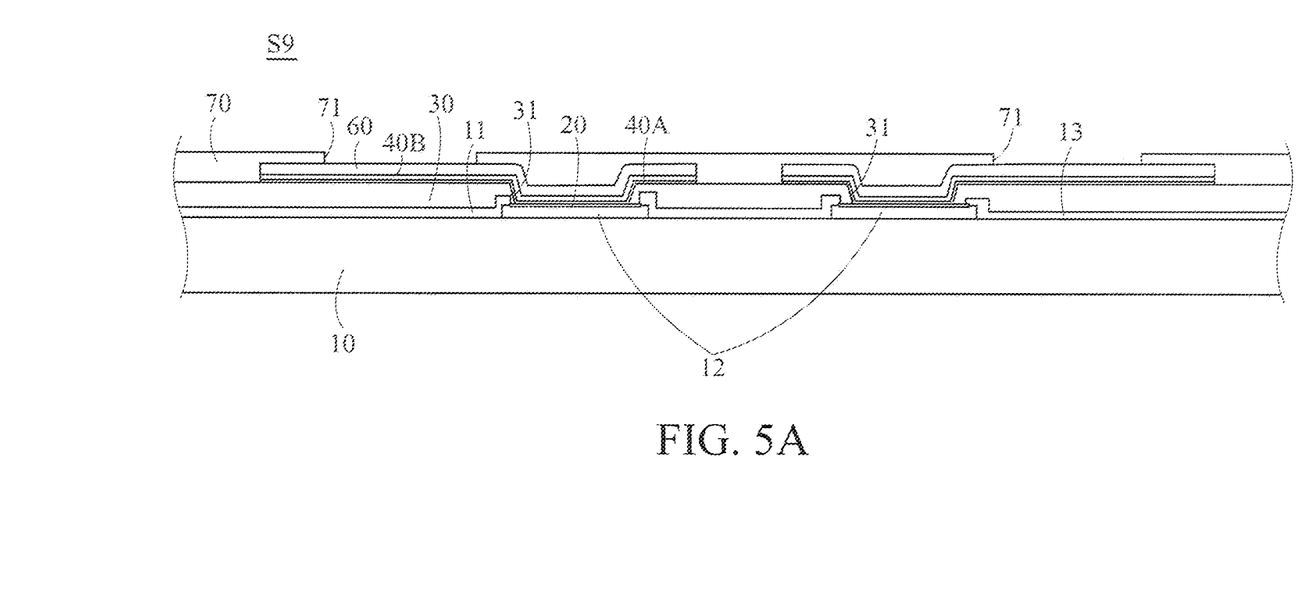

First, in step S9 as shown in FIG. 5A, a third dielectric layer 70 is formed on the redistribution layer 60, and then, part of the third dielectric layer 70 is removed to expose part of the redistribution layer 60 from the third dielectric layer 70. In other words, the third dielectric layer 70 initially covers the top surface of the redistribution layer 60, and then part of the third dielectric layer 70 is removed through a photolithography process or a laser process or the like process (i.e., to form a plurality of through holes 71) to expose part of the top surface of the redistribution layer 60. The through holes 71 may be disposed to be offset from the connection pads 12 so that the through holes 71 are not located right above the connection pads 12.

Figure 5B:
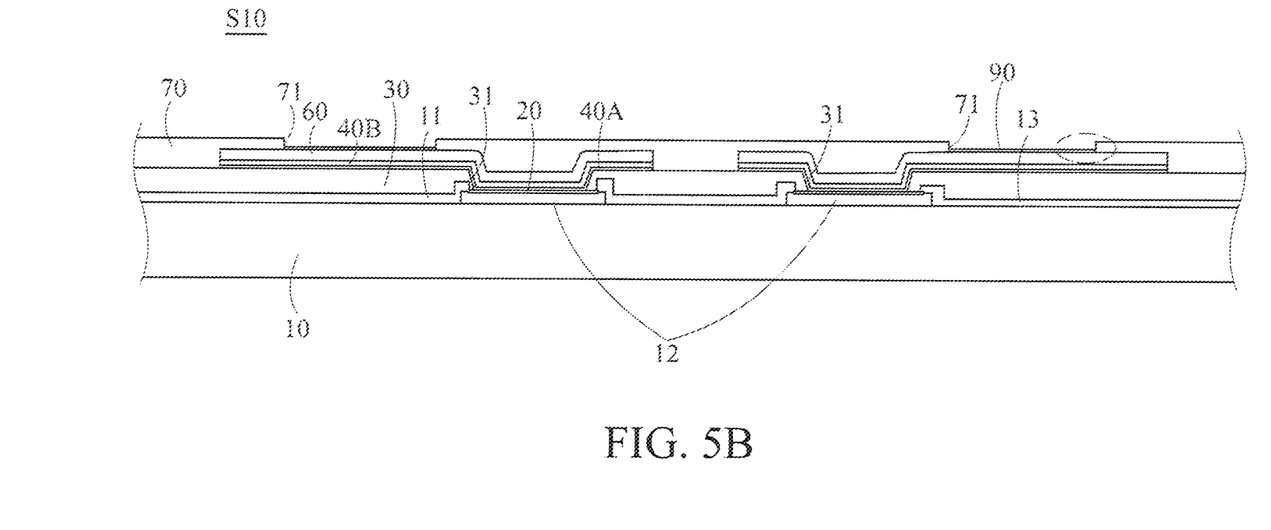
Figure 5C:
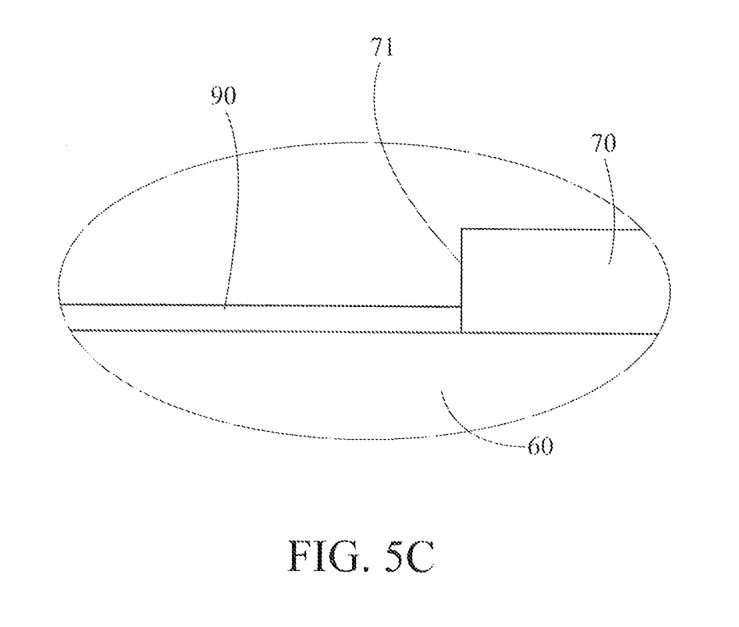
FIG. 5C is a partially enlarged detailed view of FIG. 5B.

Thereafter, in step S10 shown in FIGS. 5B~5C, an alloy layer 90 is formed on the exposed redistribution layer 60. The alloy layer 90 is located in the through holes 71, and comes into contact with and is bonded to the redistribution layer 60.

Figure 5D:
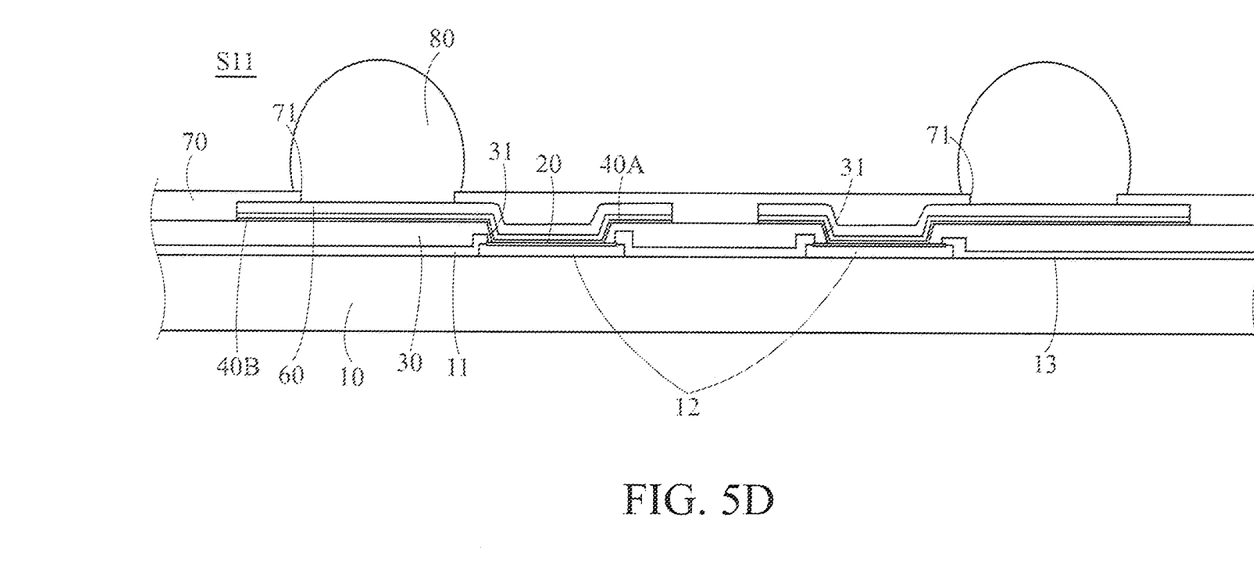

Finally, in step S11 as shown in FIG. 5D, a plurality of bumps 80 is disposed on the alloy layer 90. The bumps 80 are respectively located in the through holes 71, and comes into contact with and are bonded to the alloy layer 90. If there is no need to form the alloy layer 90, the bumps 80 may be disposed on the exposed redistribution layer 60 directly to make contact with the redistribution layer 60.

After steps S9~S11 are completed, the semiconductor packaging structure 1' in the second embodiment can be obtained.

According to the above descriptions, the embodiments of the present invention provide at least one semiconductor packaging structure and a method for manufacturing the same. The semiconductor packaging structure comprises a metal barrier layer to protect the connection pads of the chip; the metal barrier layer, the first metal seed layer and the second metal seed layer may all be formed through electroless plating to save the manufacturing cost; and for other technical features, reference may be made to the above description.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor packaging structure, comprising:
    a chip, having a top surface, a plurality of connection pads and a passivation layer, wherein the connection pads and the passivation layer are disposed on the top surface, and the passivation layer partly covers the connection pads;
    a metal barrier layer, disposed on each of the connection pads;
    a first dielectric layer, disposed on the passivation layer and the metal barrier layer, and having a plurality of through holes to expose the metal barrier layer from the first dielectric layer;
    a first metal seed layer, disposed on the first dielectric layer and the exposed metal barrier layer; and
    a second metal seed layer, disposed on the first metal seed layer.

2. The semiconductor packaging structure of claim 1, wherein materials to manufacture the metal barrier layer and the first metal seed layer are the same.

3. The semiconductor packaging structure of claim 2, wherein the materials include nickel or titanium.

4. The semiconductor packaging structure of claim 1, wherein materials to manufacture the second metal seed layer include gold or copper.

5. The semiconductor packaging structure of claim 1, wherein the first metal seed layer is disposed on part of the first dielectric layer, and the semiconductor packaging structure further comprises a redistribution layer disposed on the second metal seed layer.

6. The semiconductor packaging structure of claim 5, wherein materials to manufacture the redistribution layer and the second metal seed layer are the same.

7. The semiconductor packaging structure of claim 6, wherein the materials include copper.

8. The semiconductor packaging structure of claim 5, further comprising:
    a third dielectric layer, disposed on the redistribution layer and having a plurality of through holes to expose part of the redistribution layer from the third dielectric layer; and
    a plurality of bumps, disposed on the exposed redistribution layer.

9. The semiconductor packaging structure of claim 8, further comprising an alloy layer disposed between the exposed redistribution layer and the bumps.

* * * * *